(12) United States Patent
Osame et al.

(10) Patent No.: US 7,688,107 B2
(45) Date of Patent: Mar. 30, 2010

(54) SHIFT REGISTER, DISPLAY DEVICE, AND ELECTRONIC DEVICE

(75) Inventors: Mitsuaki Osame, Atsugi (JP); Aya Anzai, Tsukui (JP); Mizuki Sato, Atsugi (JP)

(73) Assignee: Semiconductor Energy Laboratory Co., Ltd., Atsugi-shi, Kanagawa-ken (JP)

( * ) Notice: Subject to any disclaimer, the term of this patent is extended or adjusted under 35 U.S.C. 154(b) by 0 days.

(21) Appl. No.: 11/387,782

(22) Filed: Mar. 24, 2006

(65) Prior Publication Data

US 2006/0233293 A1 Oct. 19, 2006

(30) Foreign Application Priority Data

Apr. 19, 2005 (JP) ............................. 2005-121756

(51) Int. Cl.
*H03H 11/16* (2006.01)

(52) U.S. Cl. ......................................... 326/46; 327/241

(58) Field of Classification Search .................... 326/46; 327/241; 377/64–81; 345/100, 104
See application file for complete search history.

(56) References Cited

U.S. PATENT DOCUMENTS

| | | | | |
|---|---|---|---|---|
| 5,081,377 A | * | 1/1992 | Freyman | 327/198 |
| 5,136,622 A | | 8/1992 | Plus | |
| 5,329,172 A | * | 7/1994 | Kohdaka | 327/63 |
| 5,497,114 A | * | 3/1996 | Shimozono et al. | 327/202 |
| 5,523,966 A | | 6/1996 | Idei et al. | |
| 5,883,798 A | | 3/1999 | Yamaguchi | |
| 5,936,459 A | | 8/1999 | Hamamoto | |
| 5,973,533 A | | 10/1999 | Nagaoka | |

(Continued)

FOREIGN PATENT DOCUMENTS

CN    1281208    1/2001

(Continued)

*Primary Examiner*—Rexford N Barnie
*Assistant Examiner*—Thienvu V Tran
(74) *Attorney, Agent, or Firm*—Eric J. Robinson; Robinson Intellectual Property Law Office, P.C.

(57) ABSTRACT

The present invention provides a shift register which can operate favorably without providing a level shift portion. The first clocked inverter at the (2n−1)-th stage operates in accordance with the first output from the previous stage, an output from the second clocked inverter at the previous stage, and the first CK signal; the second clocked inverter at the (2n−1)-th stage operates in accordance with the second output from the previous stage, an output of the first clocked inverter at the (2n−1)-th stage, and the first CK signal; one of the first output and the second output is equal to a potential of VDD and the other is equal to a potential of VSS; the first CK signal at the 2n-th stage operates the third output from the (2n−1)-th stage, an output of the second clocked inverter and the second CK signal; the second clocked inverter at the 2n-th stage operates in accordance with the fourth output from the (2n−1)-th stage, an output from the first clocked inverter at the 2n-th stage, and the second CK signal; one of the third output and the fourth output is equal to the potential of VDD and the other is equal to the potential of VSS, and the second CK signal is an inversion signal of the first CK signal and the amplitude of the CK signal is smaller than the power supply potential.

14 Claims, 9 Drawing Sheets

U.S. PATENT DOCUMENTS

| | | | |
|---|---|---|---|
| 5,982,211 A * | 11/1999 | Ko | 327/202 |
| 6,057,823 A | 5/2000 | Aoki et al. | |
| 6,072,345 A | 6/2000 | Ooishi | |
| 6,114,907 A | 9/2000 | Sakurai | |
| 6,232,795 B1 | 5/2001 | Takahashi et al. | |
| 6,275,210 B1 | 8/2001 | Maekawa | |
| 6,323,691 B1 | 11/2001 | Takahashi | |
| 6,380,780 B1 * | 4/2002 | Aitken et al. | 327/202 |
| 6,563,744 B2 | 5/2003 | Kuroki | |
| 6,593,920 B2 | 7/2003 | Okumura et al. | |
| 6,603,453 B2 | 8/2003 | Yamazaki et al. | |
| 6,759,701 B2 | 7/2004 | Shimizume | |
| 6,873,197 B2 * | 3/2005 | Kanba | 327/202 |
| 6,909,417 B2 | 6/2005 | Washio et al. | |
| 6,917,218 B2 * | 7/2005 | Kim et al. | 326/38 |
| 7,164,293 B2 * | 1/2007 | Ramaraju et al. | 326/98 |
| 7,183,825 B2 * | 2/2007 | Padhye et al. | 327/202 |
| 7,190,360 B1 * | 3/2007 | Hiroki | 345/213 |
| 7,193,604 B2 * | 3/2007 | Kubota et al. | 345/100 |
| 7,327,169 B2 | 2/2008 | Osame et al. | |
| 7,535,259 B2 | 5/2009 | Osame et al. | |
| 2001/0011987 A1 * | 8/2001 | Kubota et al. | 345/98 |
| 2001/0017609 A1 | 8/2001 | Okumura et al. | |
| 2001/0040469 A1 | 11/2001 | Takahashi et al. | |
| 2002/0024362 A1 | 2/2002 | Takahashi et al. | |
| 2002/0047733 A1 | 4/2002 | Shimizume | |
| 2003/0012330 A1 | 1/2003 | Osame | |
| 2003/0067322 A1 * | 4/2003 | Stan et al. | 326/46 |
| 2003/0174115 A1 * | 9/2003 | Washio et al. | 345/98 |
| 2003/0210219 A1 | 11/2003 | Osame | |
| 2004/0004593 A1 | 1/2004 | Okumura et al. | |
| 2004/0174189 A1 * | 9/2004 | Nagao et al. | 326/97 |
| 2004/0257117 A1 | 12/2004 | Kimura | |
| 2005/0184784 A1 * | 8/2005 | Washio et al. | 327/215 |
| 2005/0206607 A1 * | 9/2005 | Koyama et al. | 345/100 |
| 2006/0125518 A1 * | 6/2006 | Morosawa et al. | 326/38 |
| 2006/0202940 A1 * | 9/2006 | Azami et al. | 345/100 |
| 2007/0152946 A1 * | 7/2007 | Endou et al. | 345/100 |
| 2007/0159429 A1 | 7/2007 | Hiroki | |

FOREIGN PATENT DOCUMENTS

| | | |
|---|---|---|
| CN | 1497853 | 5/2004 |
| EP | 0984422 | 3/2000 |
| EP | 1408614 | 4/2004 |
| JP | 2000-339985 | 12/2000 |

* cited by examiner

SHIFT REGISTER, DISPLAY DEVICE, AND ELECTRONIC DEVICE

FIELD OF THE INVENTION

The present invention relates to a shift register which each includes a clocked inverter as unit circuit.

BACKGROUND ART

In recent years, display devices such as a liquid crystal display device or a light-emitting device have been developed actively because of the growth in demand for portable devices. In particular, an integration technique in which a pixel and a driver circuit (hereinafter, referred to as an internal circuit) using a transistor formed from a polycrystalline semiconductor over an insulator, has been developed actively, since the technique greatly contributes to miniaturization and lower power consumption. An internal circuit formed over the insulator is connected to a controller IC (hereinafter, referred to as an external circuit) or the like via FPC or the like and the operation is controlled.

A power supply potential of an internal circuit is usually around 10V, while an IC constituting an external circuit prepares a signal having amplitude of about 3 V, since the IC operates at a lower power supply potential than the internal circuit. There is a shift register in which a level shift portion is arranged in each stage so as to operate the internal circuit with accuracy using this signal having the amplitude of about 3 V (for example, Reference 1: Japanese Patent Laid-Open No. 2000-339985 bulletin (pp. 3-6)).

In a clocked inverter of a conventional shift register as shown in FIGS. 9A and 9B, in a case that a signal having a smaller amplitude than a potential difference between a high potential power source (VDD) and a low potential power source (VSS) is input to a gate of an n-channel transistor whose source is connected to VSS and a gate of a p-channel transistor whose source is connected to VDD, when the n-channel transistor is ON, the p-channel transistor which is needed to become OFF cannot be turned OFF completely because of the threshold vale of the transistor, and a through current flows from VDD to VSS, which leads to false operation.

SUMMARY OF THE INVENTION

When level shifting is performed in an internal circuit, problems are caused, for example, in increase in occupation area of a driver circuit, reduction of frequency property due to delayed or blunted waveforms. Furthermore, as described in Reference 1, it is necessary to suppress fluctuation in TFT characteristics between adjacent TFTs when a current driving type of shift register is used. On the contrary, when a level shifter is arranged in an external circuit, problems are caused, for example, growth in total size of a casing for devices due to the increase in the number of components such as IC, in cost for manufacturing and in power consumption by the shift register. Accordingly, it is preferable to use a signal with small amplitude without level shifting.

The present invention has been made in view of the above problems. It is an object of the present invention to realize miniaturization of a casing for devices and to reduce manufacturing costs and power consumption by providing a shift register which can operate favorably without arranging any level shifter in an external circuit. Further, in accordance with the present invention, the shift register which can operate favorably can be achieved without arranging any level shifter in an internal circuit to solve such problems that the waveform of a clock signal is delayed and blunted and that the voltage of a power source line arranged in the internal circuit is dropped. Also, it is another object of the present invention to realize the reduction of an area occupied by a driver circuit in the internal circuit, the reduction of power consumption, and a high frequency operation.

Further, a threshold voltage of a transistor is fluctuated because of fluctuation in film thickness of a gate insulating film, in gate length and gate width etc., caused by differences of used substrates or a manufacturing process, and thus the threshold voltage value may be different from an expected value in some cases. In such case, when a signal with a small amplitude is used in a digital circuit in which two logical level, 1 and 0 are used, there is a case that the transistor is not operated accurately due to the influence of the fluctuation in the threshold voltage.

Therefore, it is an object of the present invention to provide a shift register which can operate with accuracy by reducing an influence of variation on characteristics of a transistor. In view of the above problems, the present invention provides a shift register which can operate favorably using a small amplitude signal without providing a level shift portion.

One feature of the present invention is a shift register including registers at m stages (m is an arbitrary integer number, $m \geq 2$) each including a first clocked inverter and a second clocked inverter; wherein a first clocked inverter at a (2n−1)-th stage (n is an arbitrary integer, $m \geq 2n \geq 2$) operates in accordance with a first output from a register at a (2n−2)-th stage, an output from a second clocked inverter at the (2n−1)-th stage, and a first clock signal; wherein a second clocked inverter at the (2n−1)-th stage operates in accordance with a second output from the register at the (2n−2)-th stage, an output from the first clocked inverter at the (2n−1)-th stage, and the first clock signal; wherein one of the first output and the second output is equal to a potential of a high potential power source, and the other is equal to a potential of a low potential power source; wherein a first clocked inverter at a 2n-th stage (n is an arbitrary integer, $m \geq 2n \geq 2$) operates in accordance with a third output from a register at the (2n−1)-th stage, an output from a second clocked inverter at the 2n-th stage, and a second clock signal; wherein the second clocked inverter at the 2n-th stage (n is an arbitrary integer, $m \geq 2n \geq 2$) operates in accordance with a fourth output from the register at the (2n−1)-th stage, an output from the first clocked inverter at the 2n-th stage, and the second clock signal; wherein one of the third output and the fourth output is equal to the potential of the high potential power source, and the other is equal to the potential of the low potential power source; wherein the second clock signal is an inversion signal of the first clock signal; and wherein amplitudes of the first clock signal and the second signal are smaller than a potential difference between the high potential power source and the low potential power source.

One feature of the present invention is a shift register including registers at m stages (m is an arbitrary integer number, $m \geq 2$) each including a first clocked inverter and a second clocked inverter, wherein first clock signals are input into a second clocked inverter and a first clocked inverter of a (2n−1)-th stage (n is an arbitrary integer number, $m \geq 2n \geq 2$) from a first clock signal line; a first output is input into the first clocked inverter of the (2n−1)-th stage; a second output is input into the second clocked inverter of the (2n−1)-th stage; one of the first output and the second output is an output from a first clocked inverter of a (2n−2)-th stage, the other is an output from a second clocked inverter of the (2n−2)-th stage, one is set at High Level, and the other is set at Low Level; a potential of a high potential power source or a low potential power source is output from the first clocked inverter of the (2n−1)-th stage, in accordance with the first output, an output from the second clocked inverter of the (2n−1)-th stage and the first clock signal; a potential of a high potential power source or a low potential power source is output from the second clocked inverter of the (2n−1)-th stage, in accordance with the second output, an output from the first clocked inverter of the (2n−1)-th stage and the first clock signal; second clock signals are input into a first clocked inverter of a 2n-th stage (n is an arbitrary integer number, m≧2n≧2) and a second clocked inverter of the 2n-th stage from a second clock signal line; a third output is input into the first clocked inverter of the 2n-th stage, a fourth output is input into the second clocked inverter of the 2n-th stage; one of the third output and the fourth output is an output from the first clocked inverter of the (2n−1)-th stage, and the other is an output from the second clocked inverter of the (2n−1)-th stage; in accordance with the third output, an output from the second clocked inverter of the 2n-th stage and the second clock signal; a potential of the high potential power source or the low potential power source is output from the first clocked inverter of the 2n-th stage; in accordance with the fourth output, an output from the first clocked inverter of the 2n-th stage and the second clock signal, a potential of the high potential power source or the low potential power source is output from the second clocked inverter of the 2n-th stage; and the second clock signal is an inversion signal of the first clock signal.

One feature of the present invention is a shift register including registers at m stages (m is an arbitrary integer number, m≧2) each including a first clocked inverter and a second clocked inverter, wherein the first clocked inverter has a first input terminal, a second input terminal, a third input terminal and a first output terminal; the second clocked inverter has a fourth input terminal, a fifth input terminal, a sixth input terminal and a second output terminal; the first clocked inverter and the second clocked inverter both are connected to a high potential power source and a low potential power source; the first output terminal outputs a potential of the high potential power source or a potential of the low potential power source in accordance with a potential of the second input terminal; the second output terminal outputs a potential of the high potential power source or a potential of the low potential power source, in accordance with a potential of the fifth input terminal; a first output terminal of a first clocked inverter at a (2n−1)-th stage (n is an arbitrary integer number m≧2n≧2) is connected to a fifth input terminal of a second clocked inverter at the (2n−1)-th stage and a fourth input terminal of a second clocked inverter in a 2n-th stage; a second output terminal of the second clocked inverter at the (2n−1)-th stage is connected to a second input terminal of the first clocked inverter at the (2n−1)-th stage and a first input terminal of a first clocked inverter at the 2n-th stage; a third input terminal of the first clocked inverter at the (2n−1)-th stage and a sixth input terminal of the second clocked inverter at the (2n−1)-th stage are connected to a first clock signal line; a third input terminal of the first clocked inverter at the 2n-th stage and a sixth input terminal of the second clocked inverter at the 2n-th stage are connected to a second clock signal line; a potential of the first clock signal line and a potential of the second clock signal line fluctuate periodically; while one clock signal line has a potential of High Level, the other clock signal line has a potential of Low Level; at the (2n−1)-th stage, when the potential of the first input terminal is High Level, and the potential of the fourth input terminal is Low Level, the potential of the first clock signal line becomes Low Level from High Level; the potential of the low potential power source is output from the first output terminal, and the potential of the high potential power source is output from the second output terminal; when the potential of the first input terminal is Low Level, and the potential of the fourth input terminal is High Level, the potential of the first clock signal line is switched from High Level to Low Level, the potential of the high potential power source is output from the first output terminal, and a potential equal to the potential of the low potential power source is output from the second output terminal; at the 2n-th stage, in a case that the first input terminal has a potential of High Level and the fourth input terminal has a potential of Low Level, when the potential of the second clock signal line becomes Low Level from High Level, the potential of the low potential power source is output from the first output terminal, and the potential of the high potential source power is output from the second output terminal. In a case that a potential of the first input terminal is at Low Level and the potential of the fourth input terminal is at High Level, when the potential of the second clock signal line is switched from High Level to Low Level, the potential of the high potential power source is output from the first output terminal, and at the same time, the potential of the low potential power source is output from the second output terminal.

One feature of the present invention is a shift register including registers at m stages (m is an arbitrary integer number, m≧2) each including a first clocked inverter and a second clocked inverter, wherein the first clocked inverter has a first input terminal, a second input terminal, a third input terminal and a first output terminal; the second clocked inverter has a fourth input terminal, a fifth input terminal, a sixth input terminal and a second output terminal; the first clocked inverter and the second clocked inverter both are connected to a high potential power source and a low potential power source; the first output terminal outputs a potential of the high potential power source or a potential of the low potential power source in accordance with a potential of the second input terminal; the second output terminal outputs a potential of the high potential power source or a potential of the low potential power source, in accordance with a potential of the fifth input terminal; a first output terminal of a first clocked inverter at a (2n−1)-th stage (n is an arbitrary integer number m≧2n≧2) is connected to a fifth input terminal of a second clocked inverter at the (2n−1)-th stage and a first input terminal of a first clocked inverter in a 2n-th stage; a second output terminal of the second clocked inverter at the (2n−1)-th stage is connected to a second input terminal of the first clocked inverter at the (2n−1)-th stage and a fourth input terminal of a second clocked inverter at the 2n-th stage; a third input terminal of the first clocked inverter at the (2n−1)-th stage and a sixth input terminal of the second clocked inverter at the (2n−1)-th stage are connected to a first clock signal line; a third input terminal of the first clocked inverter at the 2n-th stage and a sixth input terminal of the second clocked inverter at the 2n-th stage are connected to a second clock signal line; the potential of the first clock signal line and the potential of the second clock signal line fluctuate periodically; while one clock signal line has a potential of High Level, the other clock signal line has a potential of Low Level; at the (2n−1)-th stage, when the potential of the first input terminal is High Level, and the potential of the fourth input terminal is Low Level, the potential of the first clock signal line becomes Low Level from High Level; a potential equal to the potential of the low potential power source is output from the first output terminal, and a potential equal to the potential of the high potential power source is output from the second output terminal; when the potential of the first input terminal is Low Level, and the potential of the fourth input terminal is High Level, the potential of the first clock signal line becomes Low Level from High Level, the potential of the high potential power source is output from the first output terminal, and a potential equal to the potential of the low potential power source is output from the second output terminal; at the 2n-th stage, in a case that the first input terminal has a potential of High Level and the fourth input terminal has a potential of Low Level, when the potential of the second clock signal line becomes Low Level from High Level, a potential equal to the potential of the low potential power source is output from the first input terminal, and a potential of the high potential source power is output from the second output terminal. In a case that a potential of the first input terminal is Low Level and a potential of the fourth input terminal is High Level, when the potential of the second clock signal line is switched from High Level to Low Level, the potential of the high potential power source is output from the first output terminal, and a potential of the low potential power source is output from the second output terminal.

In addition, two electrodes included in one transistor each serve as a source or a drain. Of the two electrodes, of which serves as a source or a drain is determined depending on the potential difference generated between the two electrodes. Therefore, in a case that a potential relation produced between the two electrodes (which potential is higher or lower) is varied by driving the transistor, either electrode may serve as the source or the drain.

By implementing the present invention, a shift register which can operate without providing a particular level shift portion can be provided, the occupation area of a shift register over a substrate can be reduced. By implementing the present invention, a shift register can be provided, which can turn OFF a p-channel transistor included in the other clocked inverter by using a potential of a high potential power source output via one of two clocked inverters provided in the register. In addition, a shift register of the present invention can turn OFF an n-channel transistor by each setting a potential on Low Level of the clock signal and a potential of a low potential power source equal in a case that a clock signal having a smaller amplitude than a potential difference between a high potential power source and a low potential power source is input. By turning OFF a transistor in this manner, an unintended through current in each transistor can be reduced. By implementing the present invention, a potential of a low potential power source which is output via one of two clocked inverters provided in a register is used to turn OFF an n-channel transistor included in the other clocked inverter. In addition, a shift register of the present invention can turn OFF a p-channel transistor by setting a potential on High Level of the clock signal and a potential of a high potential power source equal in a case that a clock signal having a smaller amplitude than a potential difference between a high potential power source and a low potential power source is input. By turning OFF a transistor in this manner, an unintended through current in each transistor can be reduced.

DETAILED DESCRIPTION OF THE INVENTION

EMBODIMENT MODE 1

Figure 1:
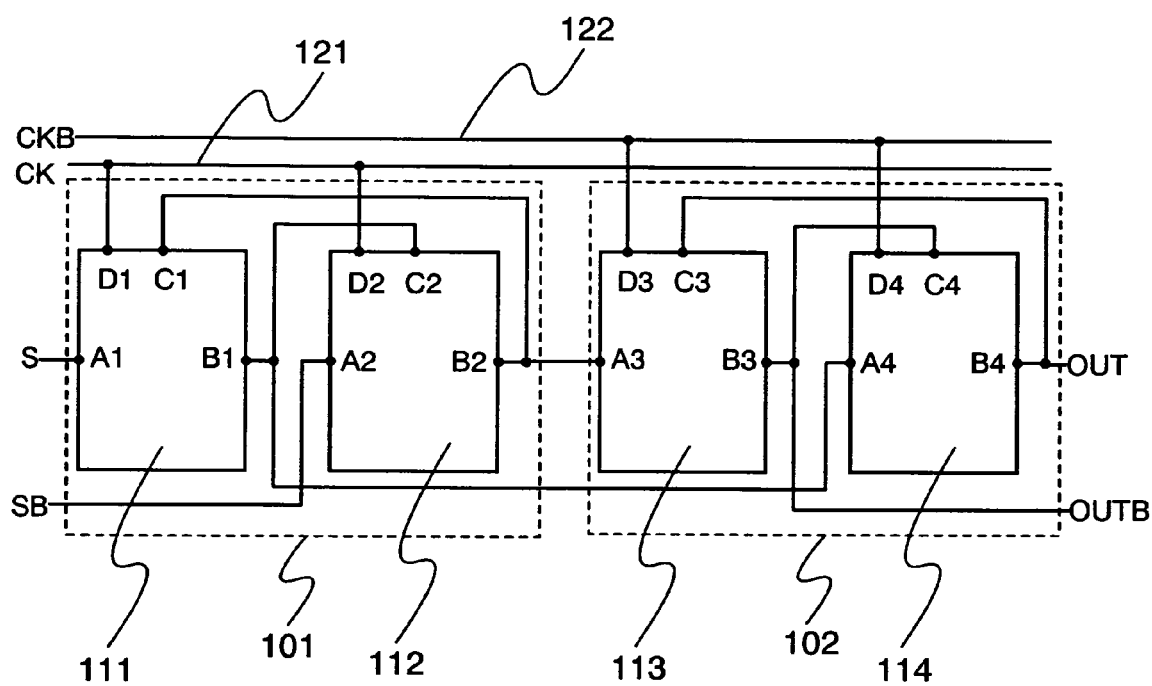
FIG. 1 shows a shift register according to one aspect of the present invention.

FIG. 1 is a circuit diagram showing one mode of a shift register of the present invention. In FIG. 1, a register 101 of a (2n−1)-th stage (n is an arbitrary integer number, m is the total number of stages provided in a shift register, m≧2n≧n) and a register 102 of a 2n-th stage are shown. The register 101 includes a first clocked inverter 111 and a second clocked inverter 112, and the register 102 includes a first clocked inverter 113 and a second clocked inverter 114. These clocked inverters are each connected to a high potential power source VDD and a low potential power source VSS.

The first clocked inverter 111 has an input terminal A1, an output terminal B1, an input terminal C1, and an input terminal D1; the second clocked inverter 112 has an input terminal A2, an output terminal B2, an input terminal C2, and an input terminal D2; the first clocked inverter 113 has an input terminal A3, an output terminal B3, an input terminal C3, and an input terminal D3, and the second clocked inverter 114 has an input terminal A4, an output terminal B4, an input terminal C4, and an input terminal D4. In the register 101, the input terminals D1 and D2 are connected to a first clock signal line 121, while in the register 102, the input terminals D3 and D4 are connected to a second clock signal line 122. The register 101 and the register 102 are different from each other at this point; however, they have the same structure except for this point. The terminals A1, A2, B1 B2, C1, C2, D1, and D2 of the register 101 correspond to the terminals A3, A4, B3, B4, C3, C4, D3, and D4 of the register 102, respectively.

In the first clocked inverter 111, the input terminal A1 is electrically connected to an output terminal of a second clocked inverter included in a register of a (2n−2)-th stage, and the output terminal B1 is electrically connected to the input terminal A4 of the second clocked inverter 114 included in the register of the 2n-th stage. In addition, in the first clocked inverter 113, the output terminal B3 is electrically connected to an input terminal of a second clocked inverter included in a register of a (2n+1)-th stage.

In addition, in the second clocked inverter 112, the input terminal A2 is electrically connected to an output terminal of a first clocked inverter included in the register of the (2n−2)-th stage, and the output terminal B2 is electrically connected to the input terminal A3 of the first clocked inverter 113 included in the register of the 2n-th stage. In addition, in the second clocked inverter 114, the output terminal B4 is electrically connected to an input terminal of a first clocked inverter included in the register of the (2n+1)-th stage.

In addition, in the register 101, the output terminal B1 of the first clocked inverter 111 is electrically connected to the input terminal C2 of the second clocked inverter 112, and the output terminal B2 of the second clocked inverter 112 is electrically connected to the input terminal C1 of the first clocked inverter 111.

In the register 102, the output terminal B3 of the first clocked inverter 113 is electrically connected to the input terminal C4 of the second clocked inverter 114, and the output terminal B4 of the second clocked inverter 114 is electrically connected to the input terminal C3 of the first clocked inverter 113.

It should be noted that the level of clock signals input from the first and second clock signal lines 121 and 122 is switched alternately in each signal line, and a signal at High Level is input from one of the clock signal lines and a signal at Low Level is input from the other clock signal line.

Here, driving of the registers 101 and 102 is described. When, in the register 101, a potential of the input terminal A1 of the first clocked inverter 111 is High Level, and a potential of the input terminal A2 of the second clocked inverter 112 is Low Level, first clock signals to be input to each of the first clocked inverter 111 and the second clocked inverter 112 via the input terminals D1 and D2 from the first clock signal line 121 are switched from Low Level to High Level. At this time, a potential of the low potential power source VSS is output from the first clocked inverter 111 via the output terminal B1, and at the same time, a potential from the high potential power source VDD is output from the second clocked inverter 112 via the output terminal B2. In other words, a potential of the input terminal C2 of the second clocked inverter 112 and a potential of the input terminal A4 of the second clocked inverter 114 are each Low Level, and a potential of the input terminal C1 of the first clocked inverter 111 and a potential of the input terminal A3 of the first clocked inverter 113 are each High Level.

In this way, after the levels of the potential of the output terminal B1 of the first clocked inverter 111 and a potential of the output terminal B2 of the second clocked inverter 112 are changed, the potentials of the output terminal B1 and the input terminal A4 are kept at Low Level and the potentials of the output terminal B2 and the input terminal A3 are kept at High Level. When the potentials of the output terminal B1, the input terminal A4, the output terminal B2, and the input terminal A3 are kept in this way, the potential of the input terminal A1 becomes Low Level from High Level, the potential of the input terminal A2 becomes High Level from Low level, and the first clock signal becomes Low level from High level.

When the input terminal A1 has a potential of Low level and the input terminal A2 has a potential of High Level, the first clock signal is switched from Low Level to High Level. Then, the potential of the high potential power source VDD is output from the first clocked inverter 111 via the output terminal B1, and at the same time, the potential of the low potential power source VSS is output from the second clocked inverter 122 via the output terminal B2. In other words, the potentials of the input terminal C2 of the second clocked inverter 112 and the input terminal A4 of the second clocked inverter 114 are each High Level, and the potentials of the input terminal C1 of the first clocked inverter 111 and the input terminal A3 of the first clocked inverter 113 are each Low Level. In this way, the levels of the potentials of the output terminal B1 of the first clocked inverter 111 and the output terminal B2 of the second clocked inverter 112 are changed again.

The register 102 operates based on the potentials of the input terminals A3 and A4, and second clock signals to be input into the first clocked inverter 113 and the second clocked inverter 114 via the input terminals D3 and D4 from the second clock signal line 122. Also in the register 102 as in the register 101, at the same time when the second clock signal (in the register 102, the second signal is input instead of the first signal) becomes High Level from Low Level, the potential levels of the output terminals B3 and B4 are changed. Here, the second clock signal is delayed by a half cycle from the first clock signal, and thus, the register 102 operates in the same way as the register 101 with a half cycle delay.

The shift register operates as a result of the above-described operation of each register. Note that there is no particular limitation on the registers 101, 102, and circuits of the first clocked inverters 111, 113 and the second clocked inverters 112, 114 included in the registers 101 and 102, and it is acceptable as long as they may operate as described above.

The shift register described above operates favorably without providing a level shift portion. Therefore, the occupation area of a driver circuit over a substrate can be reduced and the surface of the substrate can be utilized efficiently. In addition, the above-mentioned shift register can operate favorably with almost no influences of a variation of threshold value etc., even when the amplitude of a clock signal is made smaller than a potential of a power supply voltage.

EMBODIMENT MODE 2

Figure 2:
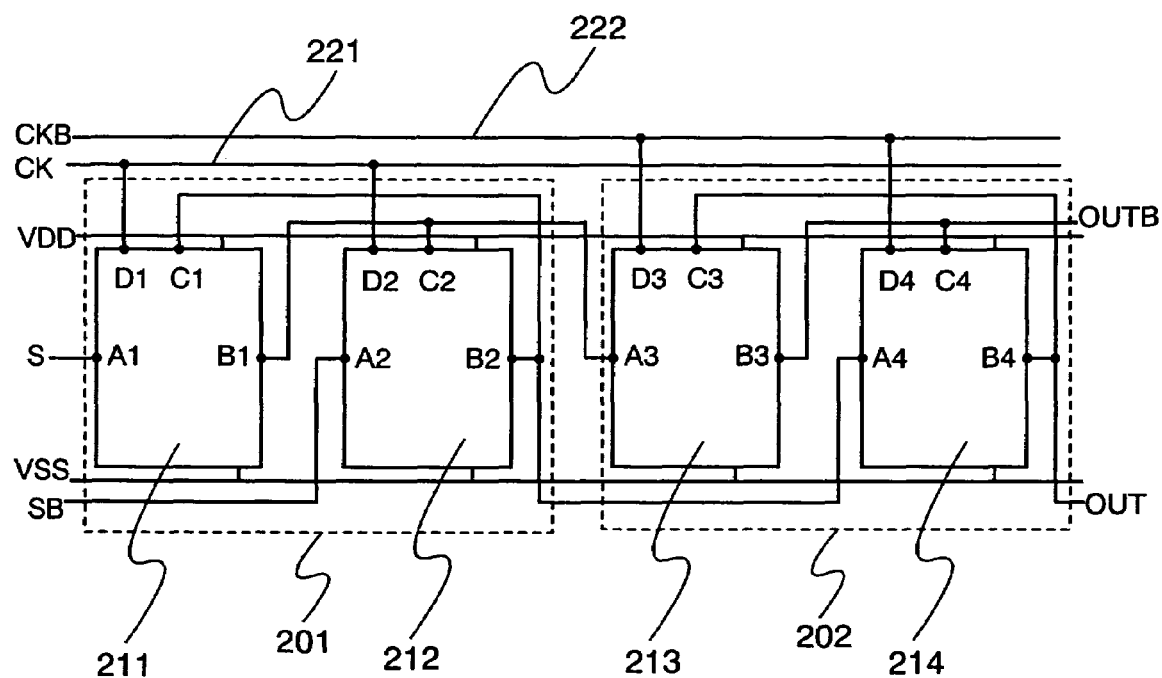
FIG. 2 shows a shift register according to one aspect of the present invention.

FIG. 2 shows a circuit diagram showing one mode of a shift register of the present invention. The circuit diagram of FIG. 2 is different from that of FIG. 1 in the connection of input terminals A1, A2, A3, A4 and output terminals B1, B2, B3, B4. In FIG. 2, a register 201 at a (2n−1)-th stage (n is an arbitrary integer number, m is the total number of stages provided in a shift register, m≧2n≧n) and a register 202 at a 2n-th stage are shown. The register 201 includes a first clocked inverter 211 and a second clocked inverter 212, and the register 202 includes a first clocked inverter 213 and a second clocked inverter 214. These clocked inverters are each connected to a high potential power source VDD and a low potential power source VSS.

The first clocked inverter 211 has an input terminal A1, an output terminal B1, an input terminal C1, and an input terminal D1; the second clocked inverter 212 has an input terminal A2, an output terminal B2, an input terminal C2, and an input terminal D2; the first clocked inverter 213 has an input terminal A3, an output terminal B3, input terminal C3, and an input terminal D3, and the second clocked inverter 214 has an input terminal A4, an output terminal B4, an input terminal C4, and an input terminal D4. In the register 201, the input terminals D1 and D2 are connected to a first clock signal line 221, while in the register 202, the input terminals D3 and D4 are connected to a second clock signal line 222. The register 201 and the register 202 are different from each other at this point; however, they have the same structure except for this point. The terminals A1, A2, B1, B2, C1, C2, D1, D2 of the register 201 correspond to the terminals A3, A4, B3, B4, C3, C4, D3, D4 of the register 202, respectively.

In the first clocked inverter 211, the input terminal A1 is electrically connected to an output terminal of a first clocked inverter included in a register a (2n−2)-th stage, and the output terminal B1 is electrically connected to the input terminal A3 of the first clocked inverter 213 included in the register of the 2n-th stage. In addition, in the first clocked inverter 213, the output terminal B3 is electrically connected to an input terminal of a first clocked inverter included in a register of a (2n+1)-th stage. In this manner, a first clocked inverter included in each stage is electrically connected to a first clocked inverter included at an adjacent stage.

In addition, in the second clocked inverter 212, the input terminal A2 is electrically connected to an output terminal of a second clocked inverter included in the register of the (2n−2)-th stage, and the output terminal B2 is electrically connected to the input terminal A4 of the second clocked inverter 214 included in the register of the 2n-th stage. In addition, in the second clocked inverter 214, the output terminal B4 is electrically connected to an input terminal of a second clocked inverter included in the register of the (2n+1)-th stage. In this manner, a second clocked inverter included in each stage is electrically connected to a second clocked inverter included at an adjacent stage.

In addition, in the register 201, the output terminal B1 of the first clocked inverter 211 is electrically connected to the input terminal C2 of the second clocked inverter 212, and the output terminal B2 of the second clocked inverter 212 is electrically connected to the input terminal C1 of the first clocked inverter 211.

In the register 202, the output terminal B3 of the first clocked inverter 213 is electrically connected to the input terminal C4 of the second clocked inverter 214, and the output terminal B4 of the second clocked inverter 214 is electrically connected to the input terminal C3 of the first clocked inverter 213.

It should be noted that the level of clock signals input from the first and second clock signal lines 221 and 222 is switched alternately in each signal line, and a signal at High Level is input from one of the clock signal lines and a signal at Low Level is input from the other clock signal line.

Here, driving of the registers 201 and 202 is described. When, in the register 201, a potential of the input terminal A1 of the first clocked inverter 211 is High Level, and a potential of the input terminal A2 of the second clocked inverter 212 is Low Level, first clock signals to be input to each of the first clocked inverter 211 and the second clocked inverter 212 via the input terminals D1 and D2 from the first clock signal line 221 are switched from Low Level to High Level. At this time, a potential of a low potential power source VSS is output from the first clocked inverter 211 via the output terminal B1, and at the same time, the potential of the high potential power source VDD is output from the second clocked inverter 212 via the output terminal B2. In other words, a potential of the input terminal C2 of the second clocked inverter 212 and a potential of the input terminal A3 of the first clocked inverter 213 are each low Level, and a potential of the input terminal C1 of the first clocked inverter 211 and a potential of the input terminal A4 of the second clocked inverter 214 are each High Level.

In this way, after Levels of the potential of the output terminal B1 of the first clocked inverter 211 and the potential of the output terminal B2 of the second clocked inverter 212 are changed, the potentials of the output terminal B1 and the input terminal A3 are kept at Low Level and the potentials of the output terminal B2 and the input terminal A4 are kept at High Level. When the potentials of the output terminal B1, the input terminal A3, the output terminal B2, and the input terminal A4 are kept in this way, the potential of the input terminal A1 becomes Low Level from High Level, the potential of the input terminal A2 becomes High Level from Low Level, and the first clock signal becomes Low Level from High Level.

When the input terminal A1 has a potential of Low level and the input terminal A2 has a potential of High Level, the first clock signal is switched from Low Level to High Level. Then, the potential of the high potential power source VDD is output from the first clocked inverter 211 via the output terminal B1, and at the same time, the potential of the low potential power source VSS is output via the output terminal B2 from the second clocked inverter 212. In other words, the potentials of the input terminal C2 of the second clocked inverter 212 and the input terminal A3 of the first clocked inverter 213 are each High Level, and the potentials of the input terminal C1 of the first clocked inverter 211 and the input terminal A4 of the second clocked inverter 214 are each Low Level. In this way, the levels of the potentials of the output terminal B1 of the first clocked inverter 211 and the output terminal B2 of the second clocked inverter 212 are changed again.

The register 202 operates based on the potentials of the input terminals A3 and A4, and second clock signals to be input into the first clocked inverter 213 and the second clocked inverter 214 via the input terminals D3 and D4 from the second clock signal line 222. Also in the register 202 as in the resister 201, at the same time when the second clock signal (in the register 202, the second signal is input instead of the first signal) becomes High Level from Low Level, the potential levels of the output terminals B3 and B4 are changed. Here, the second clock signal is delayed by a half cycle from the first clock signal, and thus, the register 202 operates in the same way as the register 201 with a half cycle delay.

The shift register operates as a result of the above-described operation of each register. Note that there is no particular limitation on the registers 201, 202, and circuits of the first clocked inverters 211, 213 and the second clocked inverters 212, 214 included in the registers 201 and 202, and it is acceptable as long as they may operate as described above.

The shift register described above can operate favorably without providing a level shift portion. Therefore, the occupation area of a driver circuit over a substrate can be reduced and the surface of the substrate can be utilized efficiently. In addition, the above-mentioned shift register can operate favorably with almost no influences of a variation of threshold value etc., even when the amplitude of a clock signal is made smaller than a potential of a power supply voltage.

EMBODIMENT MODE 3

Figure 5A:
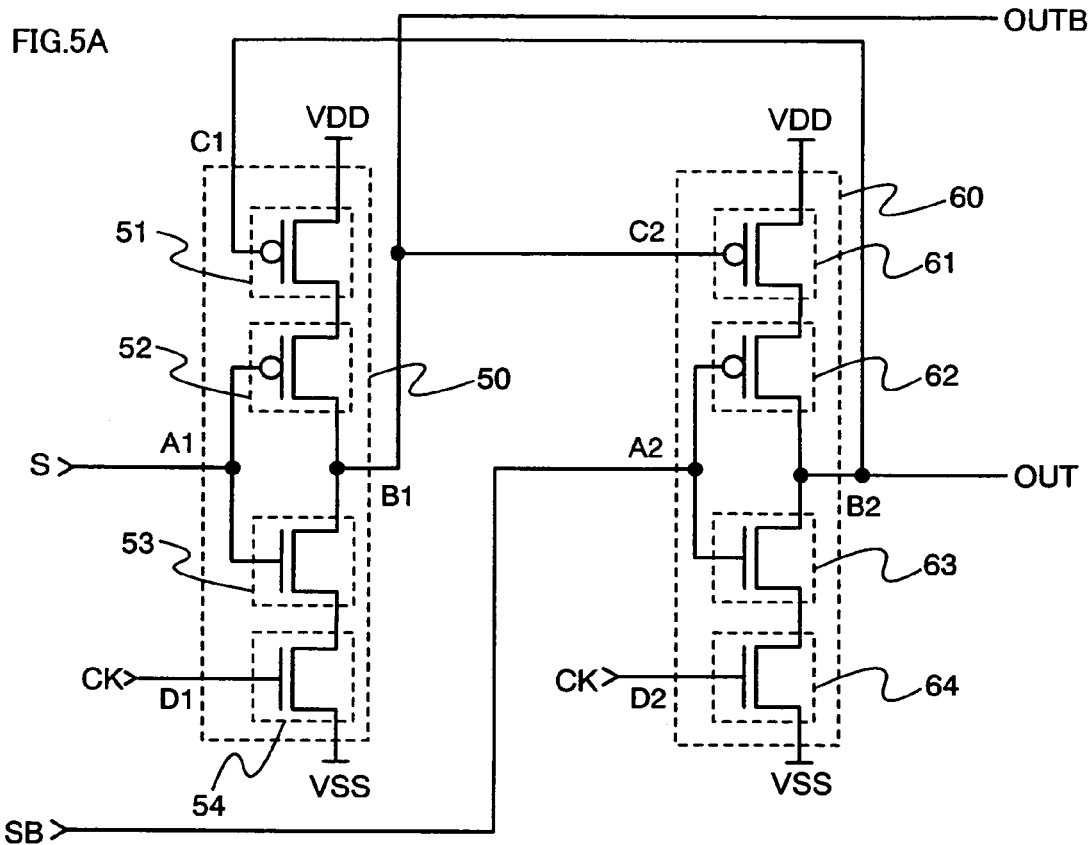
FIGS. 5A and 5B show a shift register according to one aspect of the present invention.
Figure 5B:
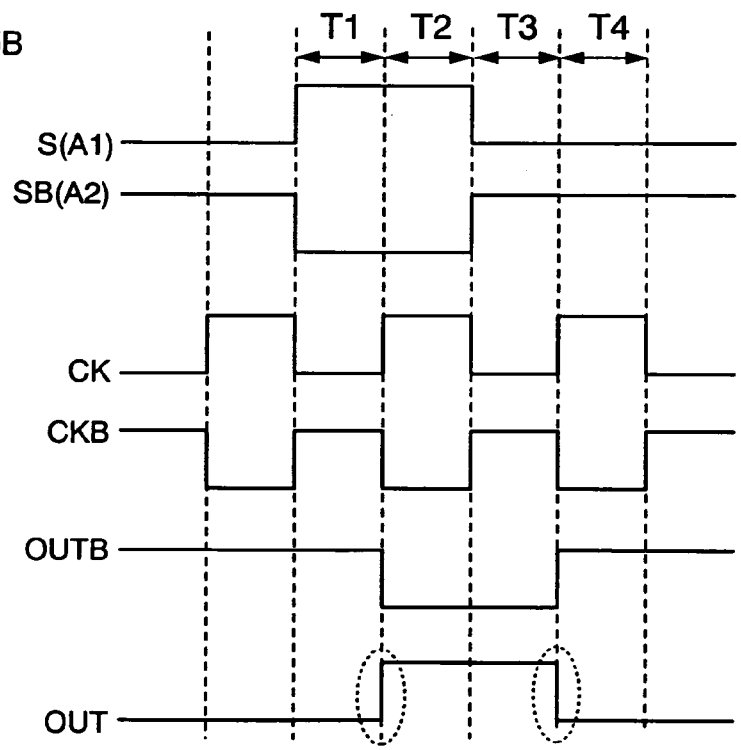

In Embodiment Mode 3, a concrete structure of each register included in the shift register described in Embodiment Mode 1 is described with reference to FIGS. 5A and 5B, exemplifying a structure of a clocked inverter. There is no particular limitation on a first clock signal, a high potential power source VDD, and a low potential power source VSS; however, for clear description, a signal at High Level of the first clock signal is e.g., 3V and a signal at Low Level is e.g., 0 V here. In addition, the high potential power source (VDD) is e.g., 7V and the low potential power source (VSS) is e.g., 0 V. In FIGS. 5A and 5B, a first clocked inverter 50 surrounded by a dotted line corresponds to the first clocked inverter 111 of Embodiment Mode 1, and a second clocked inverter 60 surrounded by a dotted line corresponds to the second clocked inverter 112 of Embodiment Mode 1.

The first clocked inverter 50 includes transistors 51 to 54 which are connected in series, and the second clocked inverter 60 includes transistors 61 to 64 which are connected in series. The transistors 51, 52, 61, and 62 are p-channel transistors and the transistors 53, 54, 63, and 64 are n-channel transistors. In this manner, the first clocked inverter 50 and the second clocked inverter 60 each include four transistors which are two p-channel transistors and two n-channel transistors in this embodiment mode.

A gate of the transistor 51 is electrically connected to the output terminal B2 of the second clocked inverter 60, the output terminal B1 of the first clocked inverter 50 is electrically connected to a gate of the transistor 61, a gate of the transistor 52 and a gate of the transistor 53 are each electrically connected to the input terminal A1, and gates of the transistors 62 and 63 are each electrically connected to the input terminal A2. Further, a clock signal line is connected to gates of the transistors 54 and 64 and a first clock signal CK is input thereto (note that in a case of a register at a 2n-th stage, the gates are connected to a second clock signal line having a different potential level from the first clock signal line, instead of being connected to the first clock signal line). The high potential power sources (hereinafter, VDD) are input to sources of the transistors 51 and 61, and the low potential power sources (hereinafter, VSS) are input to sources of the transistors 54 and 64.

An operation in a register having the structure as shown in FIG. 5A is described with reference to a timing chart of FIG. 5B. In FIG. 5B, a half cycle of a clock signal is represented by T and operations of periods T1 to T4 are explained. In FIG. 5B, A1 represents a potential in the input terminal A1, and A2 represents a potential in the input terminal A2. In addition, CK represents the first clock signal and CKB represents the second clock signal. OUT represents a potential of the output terminal B2 and OUTB represents a potential of the output terminal B1. It should be noted that in the circuit diagram shown in FIG. 5A, CKB is not input, but FIG. 5B is shown such that a potential relation of clock signals input to registers at other stages can be made clear.

In the period T1, the potential of the input terminal A1 is equal to the potential of VDD (e.g., 7 V) and the potential of the input terminal A2 is equal to the potential of VSS (e.g., 0 V). Since the first clock signal CK is Low Level (e.g., 0V), the transistor 52 is OFF, the transistor 54 is OFF, and in the first clocked inverter 50, the potential of VDD or the potential of VSS is not output to the output terminal B1. At this time, the output terminal B1 holds a potential in the previous period of the period T1, and a potential equal to the potential of VDD is input to the gate of the transistor 61. Since the transistor 62 is ON but the transistors 61, 63 and 64 are OFF, no potentials from VSS and VDD are output to the output terminal B2 of the second clocked inverter 60, and a potential in the previous period of the period T1 is held in the output terminal B1.

The period is shifted from the period T1 to the period T2, the potential of the input terminal A1 is equal to the potential of VDD and the potential of the input terminal A2 is equal to the potential of VSS, and at this state, the first clock signal CK becomes High Level (3V). Then, the transistor 54 turns ON from being OFF, and the potential of the output terminal B1 is equal to the potential of VSS. Further, the transistors 61 and 62 turn ON when a potential equal to the potential of VSS is input to the gate of the transistor 61, and thus, the potential of the output terminal B2 becomes equal to the potential of VDD.

In the period T3, the potential in the input terminal A1 is equal to the potential of VSS, the potential in the input terminal A2 is equal to the potential of VDD and CK is Low Level. As in the period T1, the potentials of VDD and VSS are not output to the output terminal B1 of the first clocked inverter 50 and the output terminal B2 of the second clocked inverter 60. Thus, the potential in the period T2 is held in the output terminal B2 and becomes equal to the potential of VDD.

The period is shifted from the period T3 to the period T4, and the first clock signal CK becomes High Level. Then, the transistor 64 turns ON from being OFF, and the potential of the output terminal B2 is equal to the potential of VSS.

In this manner, when the first clock signal CK is High Level, the outputs from the first clocked inverter 50 and the second clocked inverter 60 are determined. In addition, when potentials of VDD and VSS are not output to the output terminals of the first and second clocked inverters, the output terminals of the first and second clocked inverters hold potentials in the previous period. As just described, potentials of each output terminal can be held; however, a holding circuit may be additionally provided to hold potentials.

The shift register having such structures can operate favorably even when the amplitude of a clock signal is made smaller than a potential difference between the high potential power source and the low potential power source (hereinafter, a power source voltage).

Figure 6:
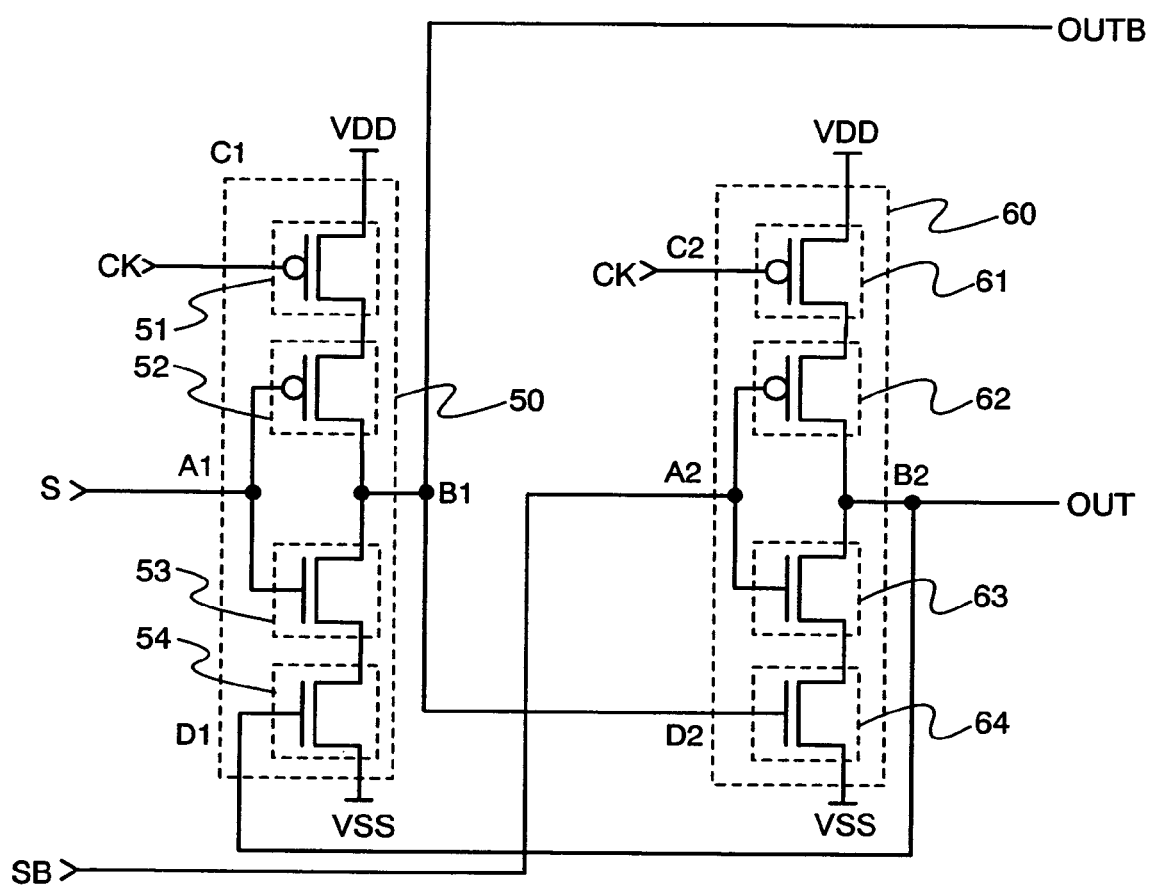
FIG. 6 shows a shift register according to one aspect of the present invention.

As to the shift register described above, an operation of a case that the potential at Low Level of the first clock signal and the potential of the low potential power source are equal is described; however, a register may operate by making the potential at High Level of the first clock signal equal to the potential of the high potential power source. In that case, as shown in FIG. 6, the register may have a circuit configuration, in which a first clock signal is input to gates of p-channel transistors 51 and 61, a gate of the n-channel transistor 54 is connected to an output terminal B2, and a gate of the n-channel transistor 64 is connected to an output terminal B1.

EMBODIMENT MODE 4

Figure 3A:
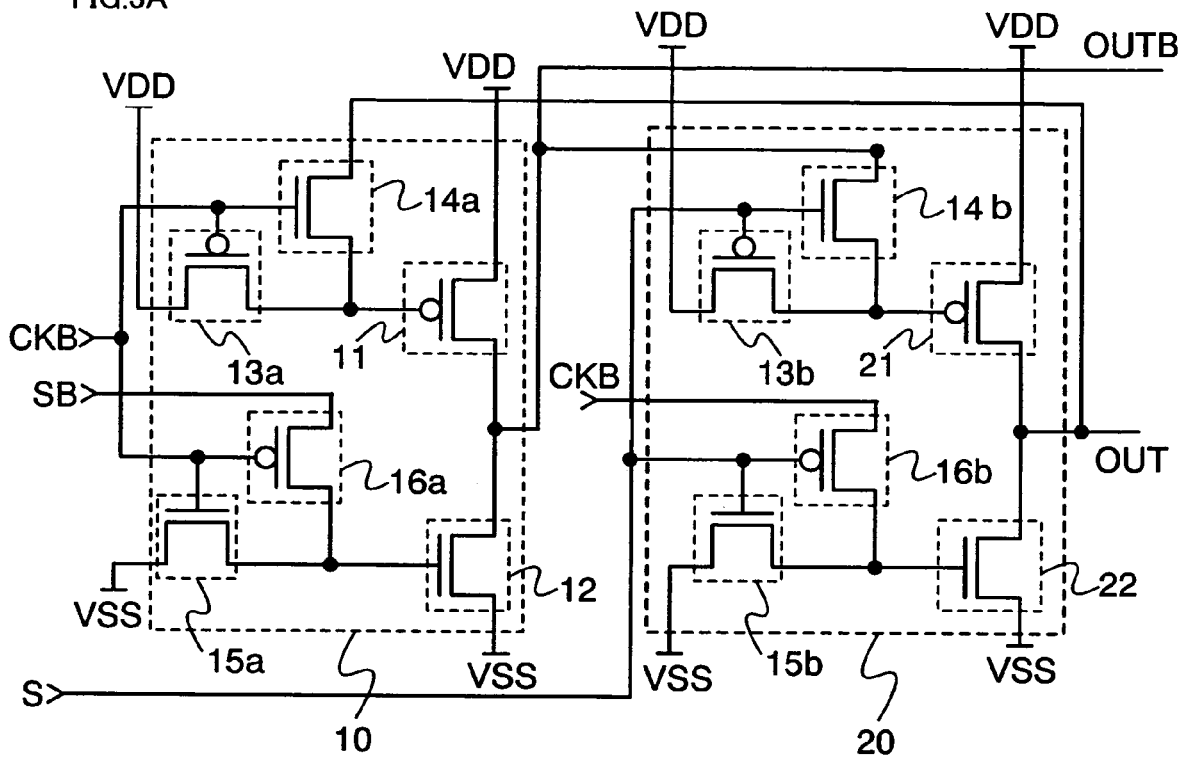
FIGS. 3A and 3B show a shift register according to one aspect of the present invention.
Figure 3B:
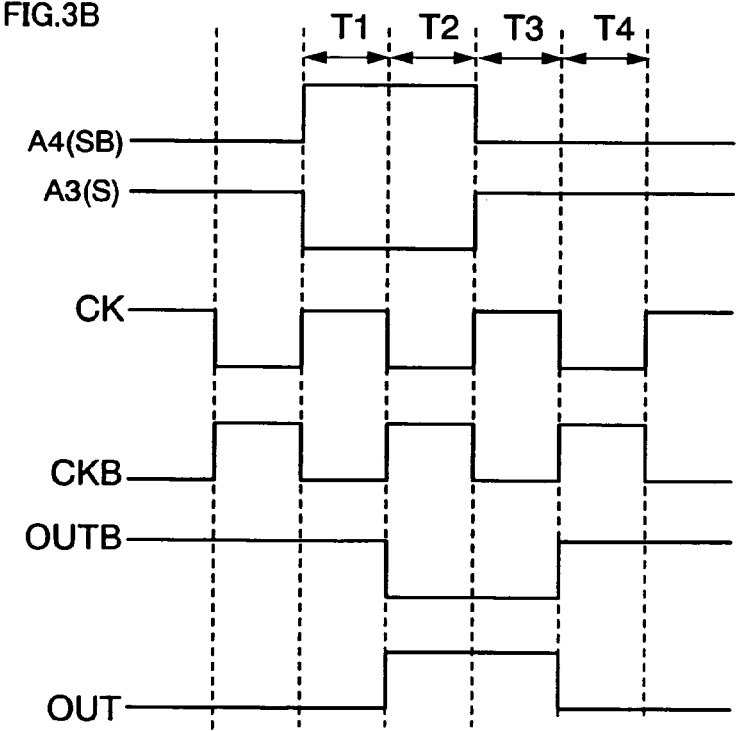

A mode of a shift register of the present invention having a clocked inverter having a different structure from that explained in Embodiment Mode 3 is described with reference to FIGS. 3A and 3B. There is no particular limitation on a second clock signal, a high potential power source VDD, and a low potential power source VSS; however, for clear description, a signal at High Level of the second clock signal is 3V and a signal of Low Level is 0 V here. In addition, a high potential power source (VDD) is 7V and a low potential power source (VSS) is 0 V. In FIGS. 3A and 3B, a first clocked inverter 10 surrounded by a dotted line corresponds to the first clocked inverter 213 of Embodiment Mode 2, and a second clocked inverter 20 surrounded by a dotted line corresponds to the second clocked inverter 214 of Embodiment Mode 2.

The shift register of this embodiment mode includes a plurality of registers shown by a circuit diagram of FIG. 3A. The first clocked inverter 10 includes transistors 11, 12, 13a, 14a, 15a, and 16a, and the second clocked inverter 20 includes transistors 21, 22, 13b, 14b, 15b, and 16b. Here, the transistors 11, 13a, 16a, 21, 13b, and 16b are p-channel transistors and the transistors 12, 14a, 15a, 22, 14b, and 15b are n-channel transistors. The transistor 13a and the transistor 14a are connected in series and gates of both transistors are connected to an input terminal A3. In addition, a source of the transistor 13a is electrically connected to the high potential power source VDD. A drain of the transistor 13a is also connected to a gate of the transistor 11 in addition to the transistor 14a. The transistor 15a and the transistor 16a are connected in series and gates of the both transistors are connected to the input terminal A3. In addition, a source of the transistor 15a is electrically connected to the low potential power source VSS. In addition, a drain of the transistor 15a is connected to a gate of the transistor 12 in addition to the transistor 16a. The transistor 13b and the transistor 14b are connected in series and gates of the both transistors are connected to an input terminal A4. In addition, a source of the transistor 13b is electrically connected to the high potential power source VDD. A drain of the transistor 13b is also connected to a gate of the transistor 21 in addition to the transistor 14b. The transistor 15b and the transistor 16b are connected in series and gates of the both transistors are connected to the input terminal A4. In addition, a source of the transistor 15b is electrically connected to the low potential power source VSS. In addition, a drain of the transistor 15b is connected to a gate of the transistor 22 in addition to the transistor 16b.

By employing such structures, in the first clocked inverter 10, the number of transistors provided in series between the high potential power source VDD and the output terminal B3 and the number of transistors provided in series between the low potential power source VSS and the output terminal B3 can be each one. In addition, in the second clocked inverter 20, the number of transistors provided in series between the high potential power source VDD and the output terminal B4 and the number of transistors provided in series between the low potential power source VSS and the output terminal B4 can be each one. Consequently, the gate width of each transistor provided between the power source and an output terminal can be made smaller than the case that plural transistors, which are connected in series and have the same conductivity, are provided between the power source and the output terminal. As a result, the load of the whole shift register can be reduced and a high frequency operation is possible.

In addition, the two transistors which are connected in series and have the same conductivity have a low current ability. However, in accordance with the present invention, a single gate transistor can be used instead of a double gate transistor, and thus, the current ability of used transistors can be made high. For example, by employing the configuration of FIG. 3A, the current ability of the p-channel transistor 11 and the n-channel transistor 12 can be made high.

Note that the current ability is defined as $K = \mu \times CoX \times W/2L$ (K: current ability, $\mu$: carrier mobility, CoX: capacitance of a gate oxide film per unit area, W channel width, and L: channel length).

The operation of one stage of the shift register at the n-th stage is explained with reference to a timing chart of FIG. 3B. In FIG. 3B, the half cycle of a clock signal is represented by T and operations of the periods T1 to T4 are explained.

In the period T1, a signal S is set at VDD (7V), a signal SB is set at VSS (0V) and CKB is set at Low Level (0V), and thus, the transistor 14a turns OFF, the transistor 15a turns OFF, the transistor 11 turns OFF, and the transistor 12 turns OFF. At this time, the clocked inverter 10 becomes high impedance, and in OUTB, the previous potential is held. In addition, OUTB is input to a source of the transistor 14b, and the transistor 21 turns OFF, the transistor 13b turns OFF, the transistor 16b turns OFF, and the transistor 22 turns OFF, and the clocked inverter 20 becomes high impedance (in other words, a state that no signals are output from VDD and VSS). Therefore, in the period T1, the clocked inverter 10 and the clocked inverter 20 become high impedance, and the previous potentials are held in OUTB and OUT.

The period is shifted to the period T2 from the period T1, and CKB turns High Level (3 V). The signal S is VDD and the signal SB is VSS. At this time, High Level is input to a gate of the transistor 12 via the transistor 16a, and the transistor 12 turns ON from being OFF, and OUTB becomes VSS. Further, VSS is input to the source of the transistor 14b, so that the transistor 21 turns ON from being OFF and OUT becomes VDD. In the present invention, the operation that a signal is changed from VSS to VDD is referred to rising.

In the period T3, the signal S is set at VSS, the signal SB is set at VDD and CKB is set at High Level, and as in the period T1, the clocked inverter 10 and the clocked inverter 20 become high impedance and OUT holds the previous potential and becomes VDD.

The period is shifted to the period T4 from the period T3, and CKB becomes High Level. At this time, High Level is input to the gate of the transistor 22 via the transistor 16b, and the transistor 22 turns ON from being OFF, and OUT becomes VSS. In the present invention, the operation that a signal is changed from VDD to VSS is referred to falling.

In this manner, in a case that the transistors 16a and 16b are ON, when CKB is L Level, the clocked inverter becomes high impedance and the previous potential is held in the output of the clocked inverter. When CKB is High Level, the output of the clocked inverter is determined.

In a first structure of the present invention, rising of OUT is determined in synchronization with rising of CKB. In other words, OUTB and OUT are determined by ON-OFF of the n-channel transistors 12 and 22.

Figure 4:
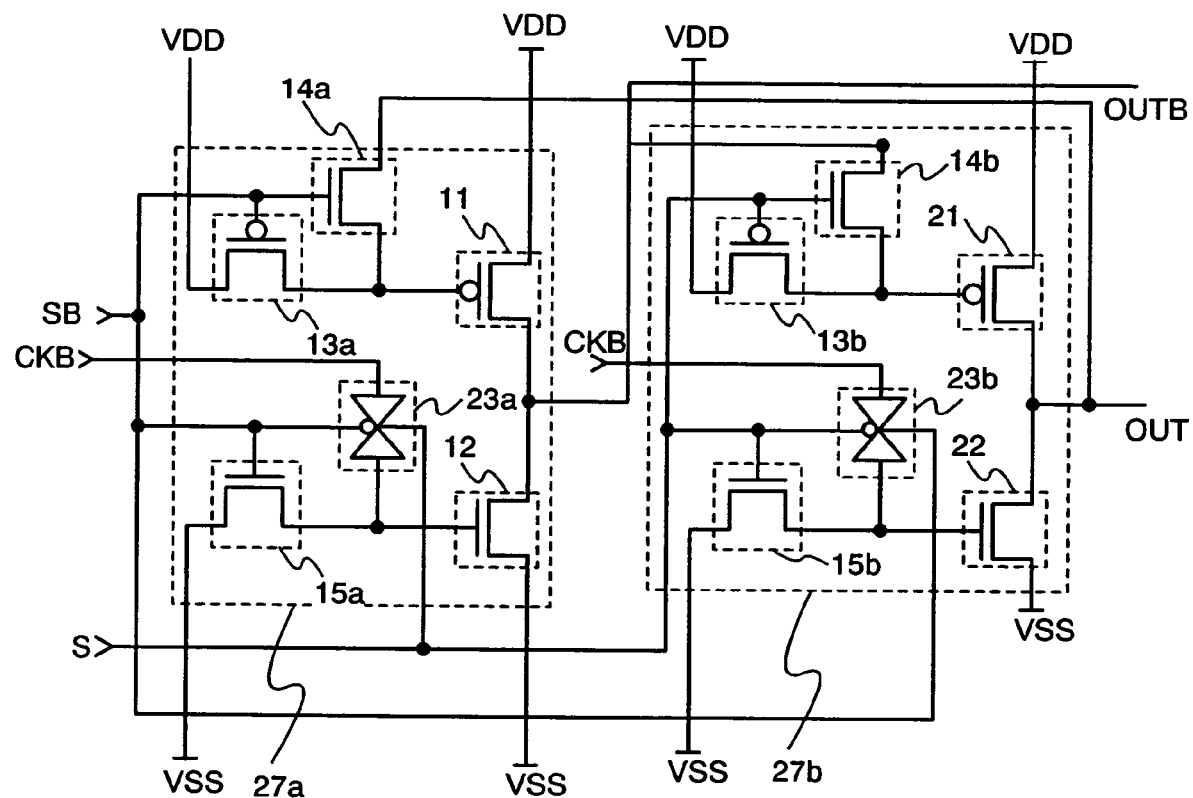
FIG. 4 shows a shift register according to one aspect of the present invention.

As shown in FIG. 4, a shift register may be employed, in which the transistor 16a of the clocked inverter 10 is substituted by an analog switch 23a of a clocked inverter 27a, and the transistor 16b of the clocked inverter 20 is substituted by an analog switch 23b of a clocked inverter 27b. In this case, the same effect as the effect of the shift register having the structure of FIG. 3A can be obtained, and the same timing chart as FIG. 3B is obtained.

EMBODIMENT MODE 5

A mode of the present invention is described with reference to FIGS. 7A to 7C.

Figure 7A:
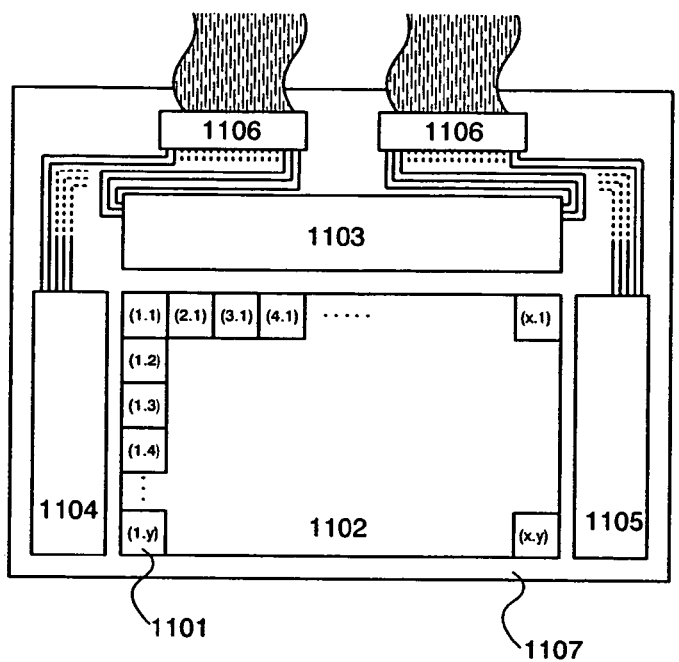
FIGS. 7A to 7C show a display device including a shift register according to one aspect of the present invention.

FIG. 7A shows an appearance of a display device, and the display device has a pixel portion 1102 in which (x×y) pixels 1101 are arranged in a matrix on a substrate 1107. A signal line driver circuit 1103, a first scanning line driver circuit 1104 and a second scanning line driver circuit 1105 are arranged around the pixel portion 1102. A signal is supplied to the signal line driver circuit 1103, the first scanning line driver circuit 1104, and the second scanning line driver circuit 1105 via a FPC 1106 from the outside. In addition, the signal line driver circuit 1103, the first scanning line driver circuit 1104 and the second scanning line driver circuit 1105 may be provided outside the substrate 1107 in which the pixel portion 1102 is formed. In FIG. 7A, one signal line driver circuit and two scanning driver circuits are provided, but the numbers of signal line driver circuit and scanning line driver circuit are not limited thereto. The numbers of them can be set arbitrarily corresponding to a structure of the pixel 1101. Note that the category of a display device in the present invention includes a panel in which a pixel portion and a driver circuit are sealed between a substrate and a cover material, a module in which an IC or the like is mounted on the panel, a display and the like.

Figure 7B:
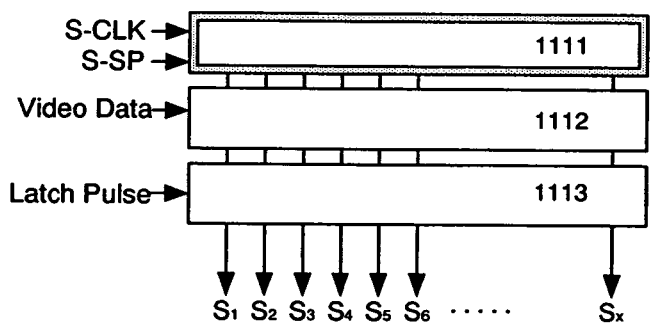
Figure 7C:
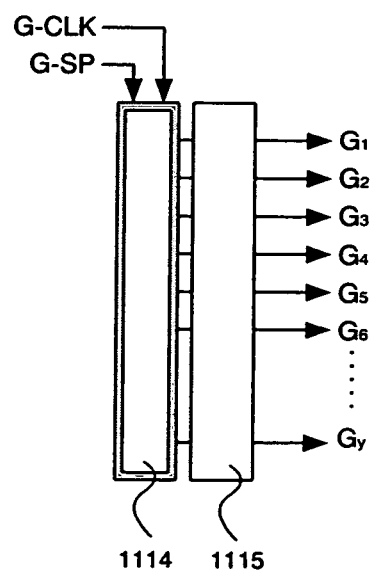

FIG. 7B shows an example of a structure of the signal line driver circuit 1103. The signal line driver circuit 1103 has a shift register 1111, a first latch circuit 1112, and a second latch circuit 1113. FIG. 7C shows an example of a structure of the first scanning line driver circuit 1104. The first scanning line driver circuit 1104 has a shift register 1114 and a buffer 1115. The shift registers 1111 and 1114 have any of structures explained in Embodiment Modes 1 to 4.

EMBODIMENT MODE 6

The following are examples of electronic devices to which the present invention is applied: cameras such as video cameras or digital cameras, goggle type displays (head mounted display), navigation systems, audio reproduction devices (car audios, audio components, etc.), notebook type personal computers, game machines, portable information terminals (mobile computers, cellular phones, mobile type game machines, electronic books, etc.), image reproduction devices provided with a recording medium (specifically, devices equipped with displays capable of reproducing the content of a recording medium such as a digital versatile disk (DVD) and displaying the image thereof), and the like. Concrete examples of such electronic devices are shown in FIGS. 8A to 8H.

Figure 8A:
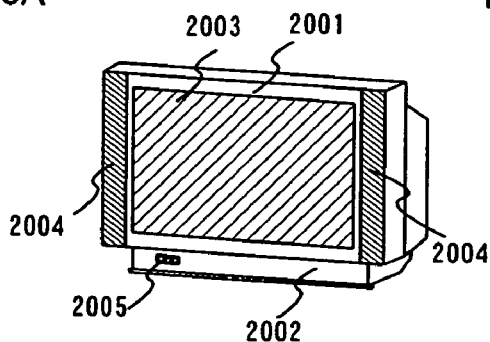
FIGS. 8A to 8H each show an electronic device which can operate by a circuit including a shift register according to one aspect of the present invention.

FIG. 8A shows a display (a light emitting device), which includes a casing 2001, a support base 2002, a display portion 2003, a speaker portion 2004, a video input terminal 2005, and the like. The present invention can be applied to a driver circuit of the display portion 2003. The light emitting device shown in FIG. 8A can be completed in accordance with the present invention. The light emitting device have a thinner display portion than a liquid crystal display device, since the light emitting device is a self-luminous and does not need a backlight. Note that all display devices for display information, for example, personal computers, devices for receiving TV broadcasting, and devices for displaying advertising, are also included in the category of the light emitting device in the present invention.

Figure 8B:
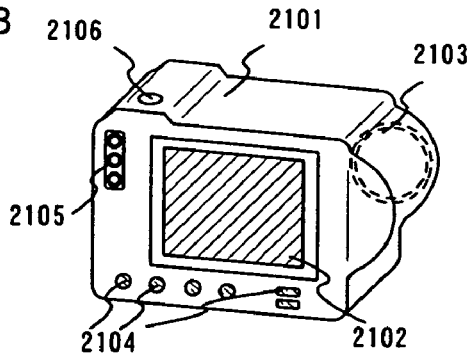

FIG. 8B shows a digital still camera, which includes a main body 2101, a display portion 2102, an image-receiving portion 2103, operation keys 2104, an external connection port 2105, a shutter 2106 and the like. The present invention can be applied to a driver circuit of the display portion 2102. The digital still camera shown in FIG. 8B is completed in accordance with the present invention.

Figure 8C:
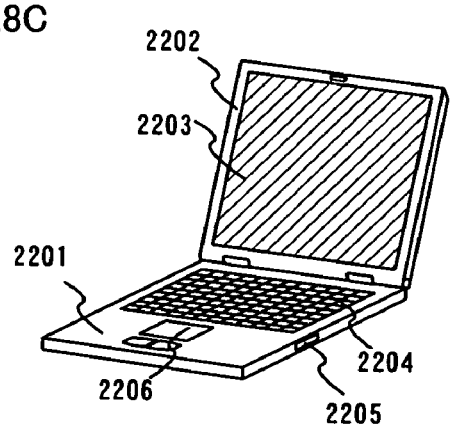

FIG. 8C shows a notebook type personal computer, which includes a main body 2201, a casing 2202, a display portion 2203, a keyboard 2204, an external connection port 2205, a pointing mouse 2206, and the like. The present invention can be applied to a driver circuit of the display portion 2203. The computer shown in FIG. 8C is completed in accordance with the present invention.

Figure 8D:
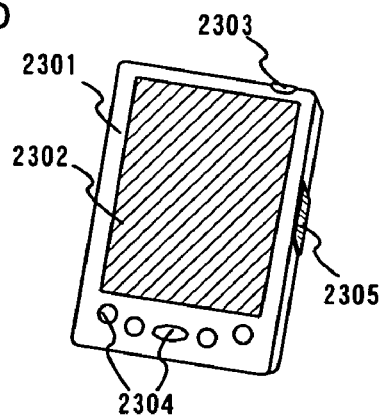

FIG. 8D shows a mobile computer, which includes a main body 2301, a display portion 2302, a switch 2303, operation keys 2304, an infrared port 2305, and the like. The present invention can be applied to a driver circuit of the display portion 2302. The mobile computer shown in FIG. 8D is completed in accordance with the present invention.

Figure 8E:
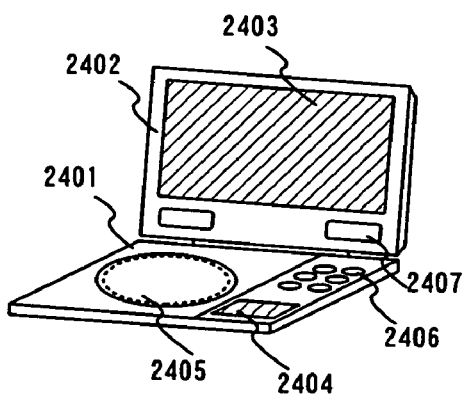

FIG. 8E shows a portable image reproduction device provided with a recording medium (specifically, a DVD player), which includes a main body 2401, a casing 2402, a display portion A 2403, a display portion B 2404, a recording medium (such as a DVD) read-in portion 2405, operation keys 2406, speaker portions 2407, and the like. The display portion A 2403 mainly displays image information, and the display portion B 2404 mainly displays character information. The present invention can be applied to driver circuits of the display portions A 2403 and B 2404. Note that the category of image reproduction devices provided with a recording medium include game machines for domestic use and the like. The image reproduction device shown in FIG. 8E is completed in accordance with the present invention.

Figure 8F:
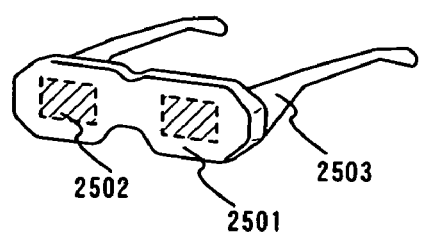

FIG. 8F shows a goggle type display (head mounted display), which includes a main body 2501, a display portion 2502, an arm portion 2503, and the like. The present invention can be applied to a driver circuit of the display portion 2502. The goggle type display shown in FIG. 8F is completed in accordance with the present invention.

Figure 8G:
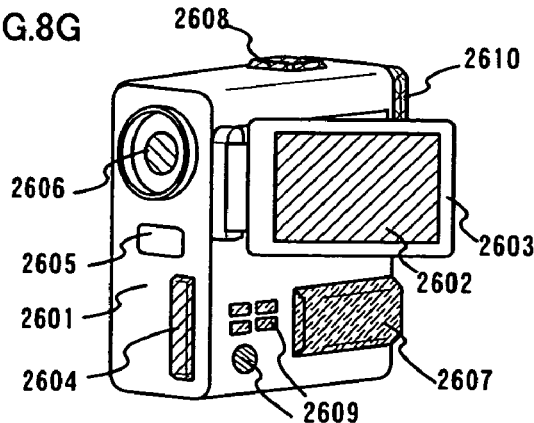

FIG. 8G shows a video camera, which includes a main body 2601, a display portion 2602, a casing 2603, an external connection port 2604, a remote-control receiving portion 2605, an image receiving portion 2606, a battery 2607, an audio input portion 2608, operation keys 2609, an eye piece 2610, and the like. The present invention can be applied to a driver circuit of the display portion 2602. The video camera shown in FIG. 8G is completed in accordance with the present invention.

Figure 8H:
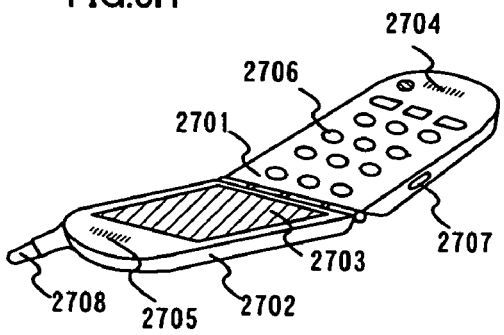
Figure 9A:
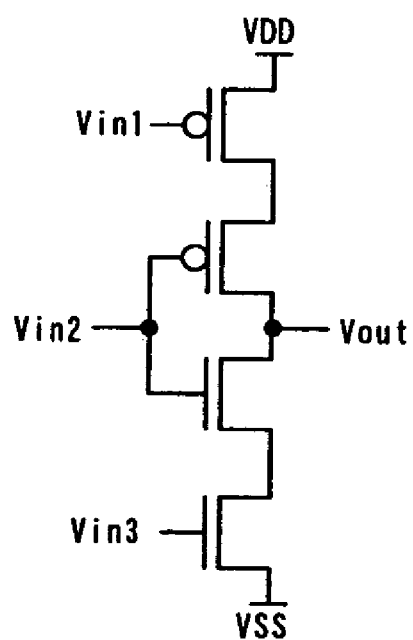
FIGS. 9A and 9B each show conventional art.
Figure 9B:
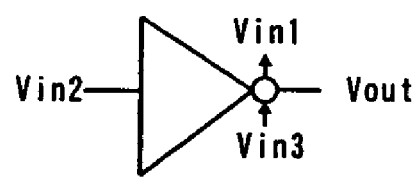

FIG. 8H shows a cellular phone, which includes a main body 2701, a casing 2702, a display portion 2703, an audio input portion 2704, an audio output portion 2705, operation keys 2706, an external connection port 2707, an antenna 2708, and the like. The present invention can be applied to a driver circuit of the display portion 2703. Note that by displaying white characters on a black background in the display portion 2703, the power consumption of the cellular phone can be reduced. The cellular phone shown in FIG. 8H is completed in accordance with the present invention.

Note that the present invention which can achieve miniaturization of a casing, reduction in occupation area of a driver circuit in an inner circuit, reduction of manufacturing cost, reduction of power consumption, a high frequency operation provides all electronic devices described above with excellent synergetic effects, and in particular, provides mobile terminals with excellent synergetic effects.

As described above, the present invention can be widely applied to and used in electronic devices in various fields.

This application is based on Japanese Patent Application No. 2005-121756 filed in Japan Patent Office on Apr. 19, 2005, the entire contents of which are hereby incorporated by reference.

What is claimed is:

1. A shift register comprising:
registers at m stages (m is an arbitrary integer number, m≧2) each including a first clocked inverter and a second clocked inverter;
wherein a first clocked inverter at a (2n−1)-th stage (n is an arbitrary integer, m≧2n≧2) operates in accordance with a first output from a second clocked inverter at a (2n−2)-th stage, an output from a second clocked inverter at a (2n−1)-th stage, and a first clock signal;
wherein a second clocked inverter at the (2n−1)-th stage operates in accordance with a second output from a first clocked inverter at the (2n−2)-th stage, an output from the first clocked inverter at the (2n−1)-th stage, and the first clock signal;
wherein the second output is an inversion signal of the first output;
wherein a first clocked inverter at a 2n-th stage (n is an arbitrary integer, m≧2n≧2) operates in accordance with a third output from a second clocked inverter at the (2n−1)-th stage, an output from a second clocked inverter at the 2n-th stage, and a second clock signal;
wherein the second clocked inverter at the 2n-th stage operates in accordance with a fourth output from the first clocked inverter at the (2n−1)-th stage, an output from the first clocked inverter at the 2n-th stage, and the second clock signal;
wherein the fourth output is an inversion signal of the third output;
wherein the second clock signal is an inversion signal of the first clock signal.

2. The shift register according to claim 1, wherein the first clocked inverter and the second clocked inverter are formed using a plurality of thin film transistors.

3. The shift register according to claim 1, wherein the first and the second clocked inverters each include three p-channel transistors and three n-channel transistors.

4. The shift register according to claim 1, wherein the first clocked inverter and the second clocked inverter each include an analog switch.

5. A display device having the shift register according to claim 1.

6. The electronic device having the display device according to claim 5.

7. The shift register according to claim 1, wherein amplitudes of the first clock signal and the second clock signal are smaller than a potential difference between the high potential power source and the low potential power source.

8. A shift register comprising:
registers at m stages (m is an arbitrary integer number, $m \geq 2$) each including a first clocked inverter and a second clocked inverter;
wherein a first clocked inverter at a (2n−1)-th stage (n is an arbitrary integer, $m \geq 2n \geq 2$) operates in accordance with a first output from a first clocked inverter at a (2n−2)-th stage, an output from a second clocked inverter at a (2n−1)-th stage, and a first clock signal;
wherein a second clocked inverter at the (2n−1)-th stage operates in accordance with a second output from the second clocked inverter at the (2n−2)-th stage, an output from the first clocked inverter at the (2n−1)-th stage, and the first clock signal;
wherein the second output is an inversion signal of the first output;
wherein a first clocked inverter at a 2n-th stage (n is an arbitrary integer, $m \geq 2n \geq 2$) operates in accordance with a third output from the first clocked inverter at the (2n−1)-th stage, an output from a second clocked inverter at the 2n-th stage, and a second clock signal;
wherein the second clocked inverter at the 2n-th stage operates in accordance with a fourth output from the second clocked inverter at the (2n−1)-th stage, an output from the first clocked inverter at the 2n-th stage, and the second clock signal;
wherein the fourth output is an inversion signal of the third output; and
wherein the second clock signal is an inversion signal of the first clock signal; and 9. The shift register according to claim 8, wherein the first clocked inverter and the second clocked inverter are formed using a plurality of thin film transistors.

10. The shift register according to claim 8, wherein the first and the second clocked inverters each include three p-channel transistors and three n-channel transistors.

11. The shift register according to claim 8, wherein the first clocked inverter and the second clocked inverter each include an analog switch.

12. The display device having the shift register according to claim 8.

13. The electronic device having the display device according to claim 12.

14. The shift register according to claim 8, wherein amplitudes of the first clock signal and the second clock signal are smaller than a potential difference between the high potential power source and the low potential power source.

* * * * *